(12) United States Patent
Qu et al.

(10) Patent No.: US 11,785,814 B2
(45) Date of Patent: Oct. 10, 2023

(54) DISPLAY PANEL AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Yi Qu, Beijing (CN); Hao Zhang, Beijing (CN); Linhong Han, Beijing (CN); Meng Zhang, Beijing (CN); Jie Dai, Beijing (CN); Yang Zhou, Beijing (CN); Yi Zhang, Beijing (CN); Chang Luo, Beijing (CN); Shun Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 154 days.

(21) Appl. No.: 17/297,665

(22) PCT Filed: Aug. 31, 2020

(86) PCT No.: PCT/CN2020/112732
§ 371 (c)(1),
(2) Date: May 27, 2021

(87) PCT Pub. No.: WO2022/041281
PCT Pub. Date: Mar. 3, 2022

(65) Prior Publication Data
US 2022/0310747 A1    Sep. 29, 2022

(51) Int. Cl.
*G09G 3/00* (2006.01)
*G09G 3/3233* (2016.01)
(Continued)

(52) U.S. Cl.
CPC .......... *H10K 59/131* (2023.02); *G09G 3/035* (2020.08); *G09G 3/3233* (2013.01);
(Continued)

(58) Field of Classification Search
None
See application file for complete search history.

(56) References Cited

U.S. PATENT DOCUMENTS

| 10,170,534 B1 | 1/2019 | Kim et al. |
| 2015/0187279 A1 | 7/2015 | Lee et al. |

(Continued)

FOREIGN PATENT DOCUMENTS

| CN | 106847085 A | 6/2017 |
| CN | 106910842 A | 6/2017 |

(Continued)

*Primary Examiner* — Matthew Yeung
(74) *Attorney, Agent, or Firm* — ArentFox Schiff LLP; Michael Fainberg

(57) ABSTRACT

Disclosed are a display panel and a display device. The display panel includes: at least one group of gate driving signal lines, the gate driving signal lines starting from the driving chip bonding area and going around the display area after passing through the bending area; and at least two first driving voltage lines, the at least two first driving voltage lines respectively starting from the flexible printed circuit bonding area, going through the bending area after passing through two sides of the driving chip bonding area, and extending to be close to the display area, and the at least two first driving voltage lines are respectively at two sides of the at least one group of gate driving signal lines.

17 Claims, 10 Drawing Sheets

(51) Int. Cl.
*G09G 3/3266* (2016.01)
*H10K 59/131* (2023.01)

(52) U.S. Cl.
CPC ... *G09G 3/3266* (2013.01); *G09G 2300/0408* (2013.01); *G09G 2310/0281* (2013.01); *G09G 2320/0233* (2013.01)

(56) References Cited

U.S. PATENT DOCUMENTS

| | | | |
|---|---|---|---|
| 2015/0255527 A1* | 9/2015 | Oooka | H01L 27/3276 438/18 |
| 2017/0154945 A1* | 6/2017 | Shin | G09G 3/3225 |
| 2017/0287936 A1 | 10/2017 | Kim et al. | |
| 2017/0345877 A1 | 11/2017 | Hwang | |
| 2018/0019294 A1 | 1/2018 | Zhai | |
| 2020/0058729 A1* | 2/2020 | Jung | H10K 59/124 |
| 2020/0119127 A1 | 4/2020 | Tian et al. | |
| 2020/0243021 A1 | 7/2020 | Li et al. | |
| 2021/0036088 A1* | 2/2021 | Jo | G09G 3/3233 |
| 2021/0225982 A1 | 7/2021 | Yi | |
| 2021/0280660 A1 | 9/2021 | Chen et al. | |
| 2022/0302233 A1* | 9/2022 | Liu | H01L 27/1222 |

FOREIGN PATENT DOCUMENTS

| | | |
|---|---|---|
| CN | 107123666 A | 9/2017 |
| CN | 107275365 A | 10/2017 |
| CN | 107452773 A | 12/2017 |
| CN | 107799576 A | 3/2018 |
| CN | 108109529 A | 6/2018 |
| CN | 108281118 A | 7/2018 |
| CN | 108598118 A | 9/2018 |
| CN | 109326628 A | 2/2019 |
| CN | 109509771 A | 3/2019 |
| CN | 109585525 A | 4/2019 |
| CN | 109754753 A | 5/2019 |
| CN | 110649068 A | 1/2020 |
| CN | 110660837 A | 1/2020 |
| CN | 110707127 A | 1/2020 |
| CN | 111048021 A | 4/2020 |
| CN | 210574777 U | 5/2020 |
| CN | 111583842 A | 8/2020 |
| KR | 20180035446 A | 4/2018 |

* cited by examiner

DISPLAY PANEL AND DISPLAY DEVICE

CROSS REFERENCE TO RELATED APPLICATIONS

The present application is a US National Stage of International Application No. PCT/CN2020/112732, filed on Aug. 31, 2020, the content of which is incorporated by reference herein in its entirety.

FIELD

The present disclosure relates to the technical field of display, in particular to a display panel and a display device.

BACKGROUND

Compared with a traditional Liquid Crystal Display (LCD), an Active Matrix Organic Light-Emitting Diode (AMOLED) can achieve self-luminescence, has larger color gamut and higher contrast, and is lighter and thinner, which makes it widely used in mobile phones, tablet computers and other fields, and widely used in the field of flexible wearable equipment such as smart watches.

SUMMARY

A display panel provided by embodiments of the present disclosure has a display area and a peripheral area outside the display area. The peripheral area includes a bending area, a driving chip bonding area and a flexible printed circuit bonding area, where the bending area is closer to the display area than the flexible printed circuit bonding area, and the driving chip bonding area is located between the bending area and the flexible printed circuit bonding area. The display panel includes: at least one group of gate driving signal lines, where the gate driving signal lines start from the driving chip bonding area to go around the display area after passing through the bending area; and at least two first driving voltage lines, wherein the at least two first driving voltage lines respectively start from the flexible printed circuit bonding area, go through the bending area after passing through two sides of the driving chip bonding area, and extend to be close to the display area, and the at least two first driving voltage lines are respectively located at two sides of the at least one group of gate driving signal lines.

Optionally, in the display panel provided by the embodiment of the present disclosure, the number of groups of the gate driving signal lines is one, and the number of the first driving voltage lines is two; and the group of gate driving signal lines starting from the driving chip bonding area and passing through the bending area is located in a central area of the display panel, and the two first driving voltage lines are symmetrically disposed relative to the gate driving signal lines.

Optionally, the display panel provided by the embodiment of the present disclosure further includes: two second driving voltage lines located outside the at least two first driving voltage lines, where the two second driving voltage lines start respectively from the flexible printed circuit bonding area and go around the display area after passing through the bending area; and the two second driving voltage lines are symmetrically disposed relative to the gate driving signal lines.

Optionally, in the display panel provided by the embodiment of the present disclosure, a plurality of data lines are provided in the display area, two groups of data signal lines located between the gate driving signal lines and the second driving voltage lines are provided in the peripheral area, and the two groups of data signal lines are symmetrically disposed relative to the gate driving signal lines; and data signal lines start from the driving chip bonding area and are electrically connected with the plurality of data lines after passing through the bending area.

Optionally, in the display panel provided by the embodiment of the present disclosure, the first driving voltage lines and the data signal lines have an overlapping area between the bending area and the driving chip bonding area, and the first driving voltage lines cover the data signal lines in the overlapping area.

Optionally, in the display panel provided by the embodiment of the present disclosure, the data signal lines include a first portion, a second portion and a third portion. The first portion is located between the bending area and the driving chip bonding area, the second portion is located in the bending area, and the third portion is located between the display area and the bending area. The first portion and the third portion are disposed as alternating lines in a first gate layer and a second gate layer, and the second portion is disposed in a layer same as a source-drain metal layer.

Optionally, in the display panel provided by the embodiment of the present disclosure, the first driving voltage lines and the second driving voltage lines are disposed in a layer same as a source-drain metal layer.

Optionally, in the display panel provided by the embodiment of the present disclosure, the gate driving signal lines include a fourth portion and a fifth portion. The fourth portion is located between the driving chip bonding area and the bending area, and the fifth portion is located in the bending area; and the fourth portion is disposed in parallel in the first gate layer and the second gate layer, and the fifth portion is disposed in a layer same as a source-drain metal layer.

Optionally, in the above display panel provided by the embodiment of the present disclosure, the peripheral area further includes a jumper area, and the jumper area is located between the bending area and the display area; and the gate driving signal lines are disposed in a source-drain metal layer after the gate driving signal lines are disposed in parallel in the first gate layer and the second gate layer in the jumper area.

Optionally, in the display panel provided by the embodiment of the present disclosure, the gate driving signal lines further include a sixth portion and a seventh portion located in the jumper area. The sixth portion starts from the bending area to an area where the first driving voltage lines are crossed by the gate driving signal lines, and the seventh portion goes around the display area from the area where the first voltage lines are crossed by the gate driving signal lines; and the sixth portion is disposed in parallel in the first gate layer and the second gate layer, and the seventh portion is disposed in a layer same as a source-drain metal layer.

Optionally, in the display panel provided by the embodiment of the present disclosure, a first voltage line is provided in the display area, and a transfer line is provided in the jumper area, an orthographic projection of the transfer line is located between an orthographic projection the gate driving signal lines and an orthographic projection of the display area, and the first driving voltage lines are electrically connected with the first voltage line through the transfer line.

Optionally, in the display panel provided by the embodiment of the present disclosure, a plurality of cascaded gate driving circuits of which orthographic projections are located between the transfer line and the gate driving signal lines are further provided in the jumper area, an input end of each gate driving circuit is electrically connected with at least one corresponding gate driving signal line, and an output end of each gate driving circuit is electrically connected with a gate line of the display area after crossing the transfer line.

Optionally, in the display panel provided by the embodiment of the present disclosure, lines between the output ends of the gate driving circuits and the gate line include an eighth portion and a ninth portion, the eighth portion starts from the output ends of the gate driving circuits to an area where the transfer line is crossed by the lines between the output ends of the gate driving circuits and the gate line, and the ninth portion starts from the area where the transfer line is crossed by the lines between the output ends of the gate driving circuits and the gate line to the display area, and the eighth portion are disposed in parallel in the first gate layer and the second gate layer, and the ninth portion is disposed in a layer same as the source-drain metal layer.

Optionally, the display panel provided by the embodiment of the present disclosure further includes a plurality of multiplexers of which orthographic projections are located between the transfer line and the gate driving signal lines, wherein the multiplexers are spaced apart from the gate driving circuits; and each of the plurality of multiplexers comprises an input end, at least two output ends and at least two control ends, the input end is electrically connected with a corresponding data signal line, each output end is electrically connected with corresponding data line in the display area after crossing the transfer line, and each control end is electrically connected with a control line.

Optionally, in the above display panel provided by the embodiment of the present disclosure, the gate driving signal lines at least include a first type of gate driving signal lines and a second type of gate driving signal lines; the first type of gate driving signal lines start from the driving chip bonding area and go along a first side of the display area after passing through the bending area; the second type of gate driving signal lines start from the driving chip bonding area and go along a second side of the display area after passing through the bending area; and the first side and the second side are opposite.

Optionally, in the above display panel provided by the embodiment of the present disclosure, the first voltage line is in a metal grid structure.

Optionally, in the display panel provided by the embodiment of the present disclosure, the first driving voltage lines are VDD lines and the second driving voltage lines are VSS lines.

Correspondingly, an embodiment of the present disclosure also provides a display device including the display panel provided by the embodiment of the present disclosure.

DETAILED DESCRIPTION OF THE EMBODIMENTS

Figure 1:
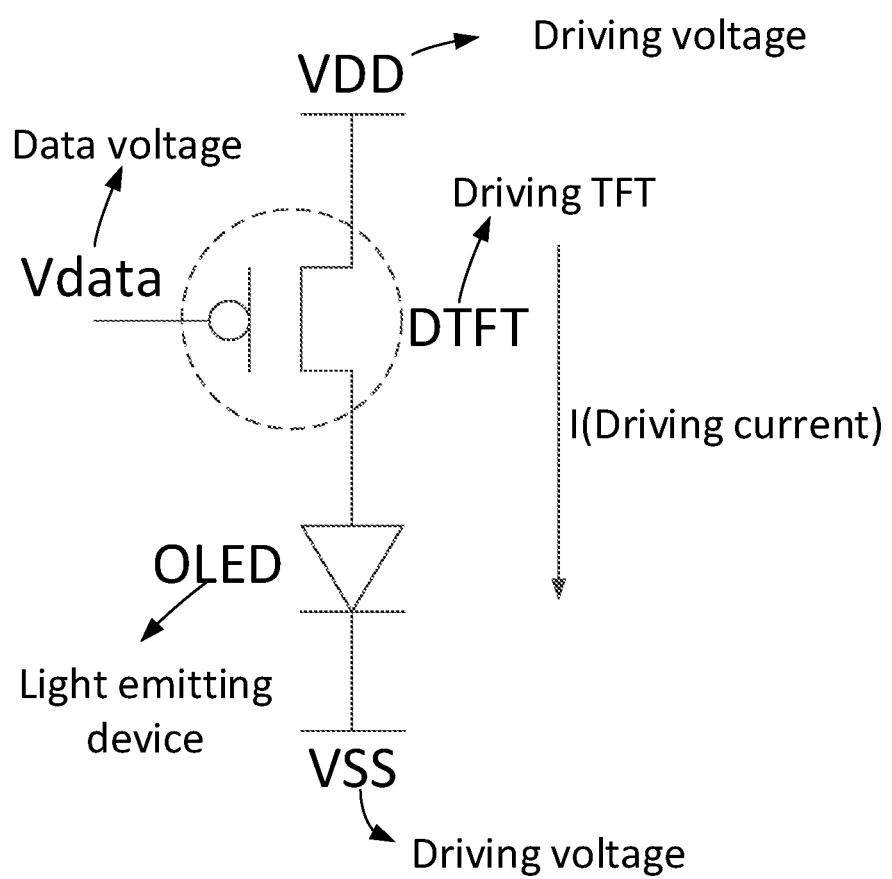
FIG. 1 is a schematic diagram of a part of a circuit structure of a pixel driving circuit in a display panel.

For making purposes, technical solutions and advantages of the embodiments of the present disclosure more clearly understood, the technical solutions of the embodiments of the present disclosure will be clearly and completely described below in conjunction with the accompanying drawings of the embodiments of the present disclosure. Obviously, the described embodiments are some of the embodiments of the present disclosure, but not all of them. In case of no conflict, embodiments and features of the present disclosure may be combined with each other. Based on the described embodiments of the present disclosure, all other embodiments obtained by those of ordinary skill in the art without creative effort fall into the scope of protection of the present disclosure.

Unless otherwise defined, technical or scientific terms used in this disclosure shall have the ordinary meaning as understood by those of ordinary skill in the art to which this disclosure pertains. As used in this disclosure, similar words such as "comprise" or "include" are intended to mean that elements or articles appearing before the word encompass elements or articles listed after the word and their equivalents, and do not exclude other elements or articles. Similar words such as "connect" or "connected" are not limited to physical or mechanical connections, but may include electrical connections, whether in a direct or indirect manner. "Inner", "outer", "upper", "lower" and the like are use only to represent a relative positional relationship, which may also change correspondingly when the absolute position of the described object changes.

It should be noted that the dimensions and shapes of the figures in the drawings do not reflect the true scale, and they only aim to illustrate the present disclosure. In addition, throughout identical or similar reference numerals denote identical or similar elements or elements having identical or similar functions.

An organic light-emitting display panel emits light under a current driving mode, that is, a pixel driving circuit outputs a stable current to drive a light emitting element to emit light. At present, the pixel driving circuit generally includes circuit structures such as 3T1C and 7T1C, as shown in FIG. 1. FIG. 1 is a schematic structural diagram of a pixel driving circuit in a light emitting stage. From the driving current formula $I=K*(Vsg-|Vth|)^2=K*(VDD-Vdata-|Vth|)^2$, it can be seen that when a relatively constant data voltage Vdata is given, the change of the driving current I depends on the stability of the driving voltage VDD, that is, the operating voltage inside the device, i.e., the light emitting element. OLED display brightness is in direct proportion to the driving current I, so the stability of the driving voltage VDD will influence the uniformity of the OLED display brightness to some extent. However, the signal of the driving voltage VDD will get weaker during transmission from a flexible printed circuit terminal to a display area, due to the increase of VDD line resistance, thus affecting the display effect.

Figure 2:
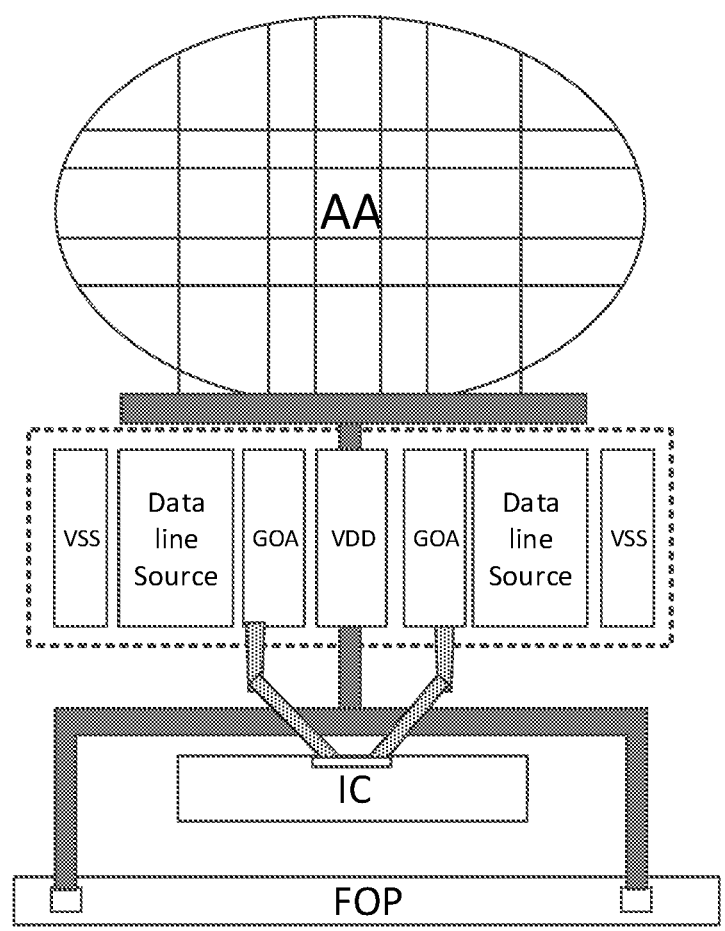
FIG. 2 is a top view of a part of film layers of a display panel provided in the related art.

For existing wearable products (such as watches), as shown in FIG. 2, the bonding mode of COP (Chip on PI)+FOP (FPC on PI) is adopted, the VDD line may be prepared using the same material as a source electrode or a drain electrode, and one line passes through the Bending Area to the display area AA. In this way, resistance of the line is large in the Bending Area, which has a great influence on the VDD signal. At the same time, signal lines such as a gate on array (GOA) line located at two sides of the VDD line are cut off by the VDD line, which is not helpful for saving space. In addition, there are more overlapping areas between the GOA signal line and the VDD line, which increases the load of the GOA signal and affects the driving and luminescence of OLED devices.

Figure 3:
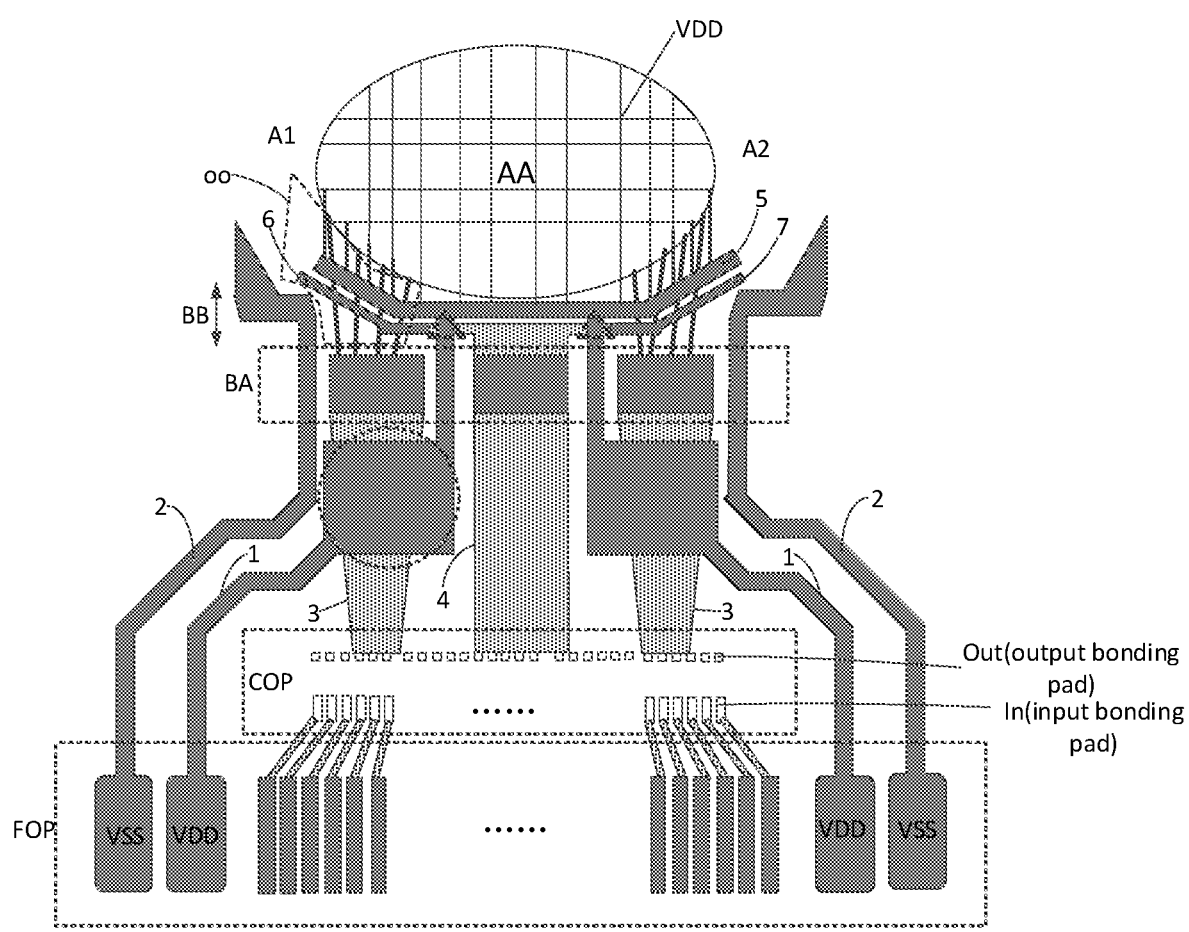
FIG. 3 is a top view of a part of film layers of a display panel provided by embodiments of the present disclosure.

In order to solve the above problems, embodiments of the present disclosure provide a display panel, which is a flexible display panel that can be bent. As shown in FIG. 3, the display panel can be divided into a display area AA and a peripheral area outside the display area AA (the area outside the area AA in FIG. 3 is the peripheral area), and the display area AA is used for displaying an image. The peripheral area includes a bending area BA, a driving chip bonding area COP and a flexible printed circuit bonding area FOP, wherein the bending area BA is closer to the display area AA than the flexible printed circuit bonding area FOP, and the driving chip bonding area COP is located between the bending area BA and the flexible printed circuit bonding area FOP. Specifically, the driving chip bonding area COP has a plurality of input bonding pads IN and a plurality of output bonding pads OUT, and the driving chip bonding area COP is used to connect a driving chip IC (not shown in FIG. 3). The flexible printed circuit bonding area FOP has a plurality of bonding pads (a rectangular structure in the area FOP in FIG. 3). The flexible printed circuit bonding area FOP is used for connecting a flexible printed circuit (FPC) (not shown in FIG. 3) which is used for inputting a driving signal to an input terminal IN of the IC, and the driving signal is transmitted to the display area AA via an output terminal OUT. Specifically, in the embodiments of the present disclosure, the driving chip IC and the flexible printed circuit FPC are disposed on a base substrate of the display panel, that is, the embodiment of the present disclosure adopts design of a COP (Chip On PI)+FOP (FPC On PI) architecture.

As shown in FIG. 3, the display panel provided by the embodiment of the present disclosure includes:

at least one group of gate driving signal lines 4 (taking a group of GOA as an example), where the gate driving signal lines 4 start from the driving chip bonding area COP to go around the display area AA after passing through the bending area BA; and specifically, the gate driving signal lines 4 are used to provide gating signals to a gate driving circuit, so that the gate driving circuit outputs gate signals to gate lines of the display area AA; and at least two first driving voltage lines 1 (taking two lines as an example), where the at least two first driving voltage lines 1 start from the flexible printed circuit bonding area FOP, extend to the bending area BA after passing through two sides respectively of the driving chip bonding area COP, and go close to the display area AA after passing through the bending area BA, and the at least two first driving voltage lines 1 are respectively at two sides of the at least one group of gate driving signal lines 4. Specifically, the first driving voltage lines 1 are configured to output driving voltage signals to a first voltage line VDD of the display area AA to drive a light emitting element of the display area AA to emit light.

As for the display panel provided by the embodiment of the present disclosure, on the one hand, the driving voltage signal is input to the first voltage line VDD of the display area AA by using the at least two first driving voltage lines 1. Compared with the prior art in which one first driving voltage line 1 is used to input a driving voltage signal to the first voltage line VDD of the display area AA, the design of the two first driving voltage lines 1 of the present disclosure reduces a VDD load difference caused by the increase of the resistance of the VDD line, is beneficial to the stability and uniformity of the VDD signal on a screen, improves the display effect, and improves the uniformity of the driving voltage signal in the display panel. On the other hand, by adopting the at least one group of gate driving signal lines 4 located between the first driving voltage lines 1, such GOA lines reduce the load formed by overlapping of signals such as GOA and other signals as much as possible, which is beneficial to reducing the load of GOA driving signals and improving the luminous reliability and display effect of the OLED devices.

Specifically, as shown in FIG. 3, the gate driving signal lines 4 and the first driving voltage lines 1 in the display panel provided by the embodiment of the present disclosure start from bonding pads of different bonding areas, to allow the number of pads of each bonding area to be uniform, thereby optimizing the structure of each bonding area.

During specific implementation, in the display panel provided by the embodiment of the present disclosure, as shown in FIG. 3, the number of groups of gate driving signal lines 4 is one, and the number of first driving voltage lines 1 is two.

The group of gate driving signal lines 4 starting from the driving chip bonding area COP and passing through the bending area BA are located in a central area of the display panel. For products with driving signal lines such as GOA lines located in the central area of the display panel, such GOA line design can shorten the length of signal lines such as GOA lines in the peripheral area as much as possible, thus reducing the influence of increased resistance caused by GOA line lengthening. In addition, since the GOA lines extend to two sides of the display panel after passing through the bending area BA, the length of the lines at two sides of the display panel can be the same by both starting from the central area, thus avoiding the risk of fracture of the longer lines caused by inconsistent line lengths on two sides when the lines extend towards the two sides of the display panel. The two first driving voltage lines 1 are symmetrically disposed relative to the gate driving signal lines 4, thus simplifying the line design.

During specific implementation, the display panel provided by the embodiments of the present disclosure, as shown in FIG. 3, further includes two second driving voltage lines 2 located at outer sides of the at least two first driving voltage lines 1. The two second driving voltage lines 2 respectively start from the flexible printed circuit bonding area FOP to go around the display area AA after passing through the bending area BA. The second driving voltage lines 2 are used for outputting driving voltage signals to a second voltage line VSS of the display area AA. In some embodiments, the VSS line is a line for common connection. The two second driving voltage lines 2 are symmetrically disposed relative to the gate driving signal lines 4, which can further simplify the line design.

It should be noted that the outer sides of the two first driving voltage lines 1 refer to sides of the two sides of the each two first driving voltage lines 1 that are farther from the GOA lines.

During specific implementation, in the display panel provided by the embodiment of the present disclosure, as shown in FIG. 3, the display area AA includes a plurality of data lines (not shown in FIG. 3) that intersect with gate lines, thereby defining a plurality of pixel units including a pixel driving circuit. The gate line is used for providing a scan signal to the pixel driving circuit, and the data line is used for providing a data signal to the pixel driving circuit. The peripheral area includes two groups of data signal lines 3 located between the gate driving signal lines 4 and the second driving voltage lines 2, where each group of data signal lines 3 include a plurality of mutually insulated data lines, and the two groups of data signal lines 3 are symmetrically disposed relative to the gate driving signal lines 4, so that the line design can be further simplified. The data signal lines 3 start from the driving chip bonding area COP, are electrically connected to the data lines of the display area AA after passing through the bending area BA, that is, the data signal output end of the driving chip bonding area COP outputs a data signal to the data signal lines 3, and the data signal is transmitted to the data lines of the display area AA through the data signal lines 3.

It should be noted that the two groups of data signal lines 3 in FIG. 3 respectively include a plurality of data signal lines 3 corresponding to the data lines one to one.

During specific implementation, in the display panel provided by the embodiment of the present disclosure, as shown in FIG. 3, between the bending area BA and the driving chip bonding area COP, the first driving voltage line 1 and the data signal line 3 have an overlapping area (shown by a circular dashed line frame), and in the overlapping area, the first driving voltage line 1 covers the data signal line 3. In this way, the overlapping area of the first driving voltage line 1 and each data signal line 3 can be the same, that is, the coupling load is the same, and the data signal is prevented from being uneven due to different coupling loads. Specifically, the shape of the first driving voltage line 1 in the overlapping area may be rectangular.

Figure 4:
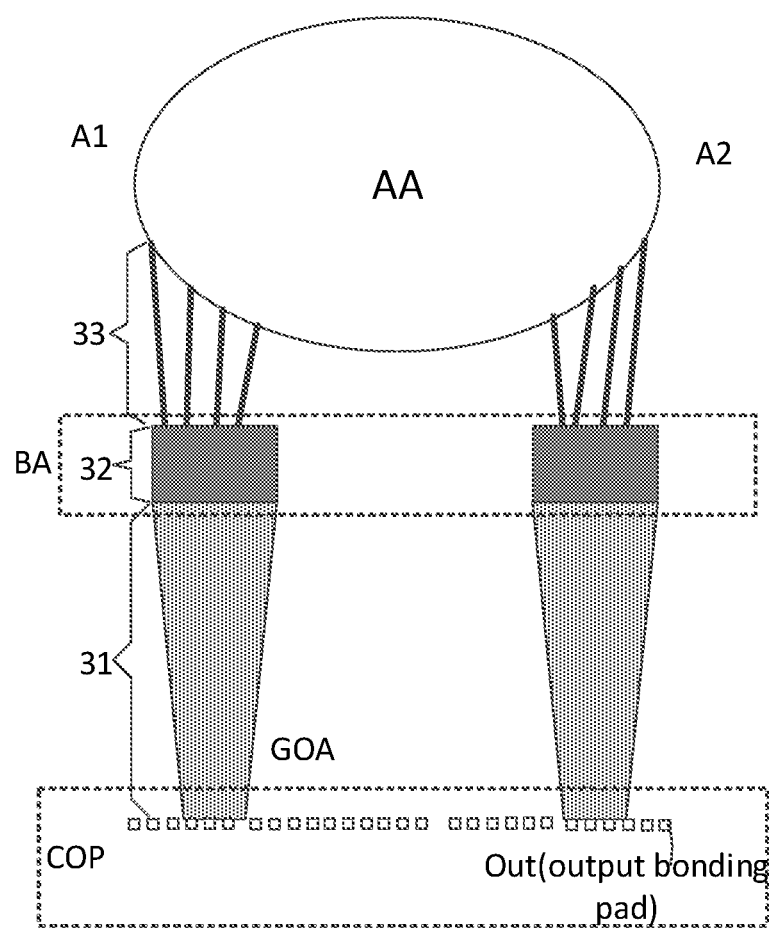
FIG. 4 is a schematic diagram of a part of structure of a display panel provided by embodiments of the present disclosure.
Figure 5:
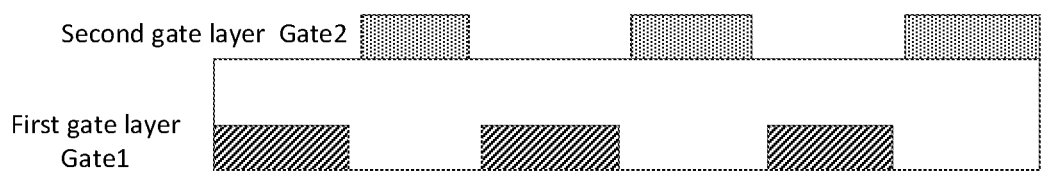
FIG. 5 is a schematic diagram of a partial cross-sectional view of a display panel provided by embodiments of the present disclosure.

During specific implementation, in the display panel provided by the embodiment of the present disclosure, as shown in FIG. 4 which is a schematic diagram of a part of structure in FIG. 3, in order to illustrate more clearly the structure of the data signal lines 3, the data signal lines 3 include a first portion 31, a second portion 32 and a third portion 33. The first portion 31 is located between the bending area BA and the driving chip bonding area COP, the second portion 32 is located in the bending area BA, and the third portion 33 is located between the display area AA and the bending area BA. The lines of the first portion 31 and the third portion 33 are disposed as alternating lines and in a first gate layer Gate1 and a second gate layer Gate2, and the schematic cross-sectional diagram of the design structure of the alternating lines along an A1A2 direction is shown in FIG. 5. Gate1 illustrates the first gate layer, Gate2 illustrates the second gate layer, and there is an insulating layer between Gate1 and Gate2 layers, so that lines in the two gate layers can reduce the possibility of short caused by lines being too many in one gate layer. For example, if there are 1080 data lines in the display panel, 540 of them are disposed in the Gate1 layer and the other 540 are disposed in the Gate2 layer, and orthographic projections of the data lines on the Gate1 layer and the data lines on the Gate2 layer on the substrate do not overlap. Since the bending area BA needs to be bent, it is necessary to use a metal layer with good ductility for wiring. Since the material of a source-drain metal layer is generally Ti/Al/Ti or an alloy structure thereof with good ductility, the second portion 32 of the data signal lines 3 located in the bending area BA is disposed as source-drain metal layer lines.

Specifically, the material of the gate layers is generally Mo metal.

During specific implementation, in the display panel provided by the embodiment of the present disclosure, as shown in FIG. 3, both the first driving voltage lines 1 and the second driving voltage lines 2 are prepared by using the same material as the source-drain metal lines.

Figure 6:
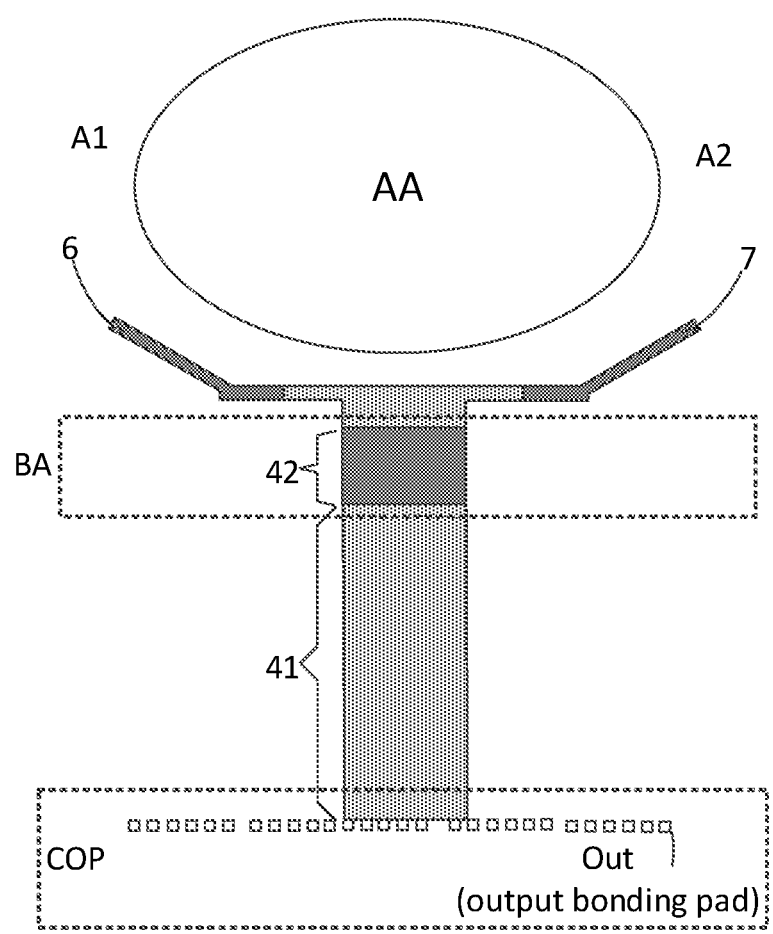
FIG. 6 is a schematic diagram of a part of structure of another display panel provided by embodiments of the present disclosure.
Figure 7:
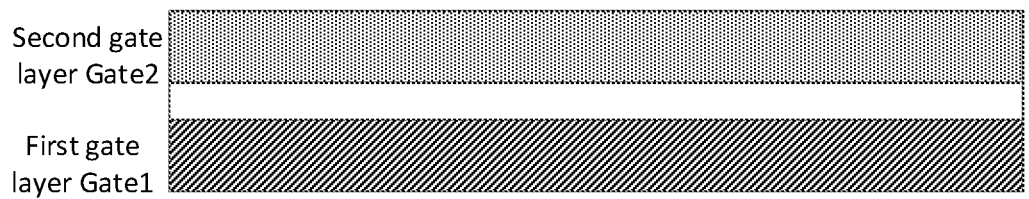
FIG. 7 is a schematic diagram of a partial cross-sectional view of another display panel provided by embodiments of the present disclosure.

During specific implementation, in the display panel provided by the embodiment of the present disclosure, as shown in FIG. 6 which is a schematic diagram of a part of structure in FIG. 3, in order to more clearly illustrate the structure of the gate driving signal lines 4. The gate driving signal lines 4 include a fourth portion 41 and a fifth portion 42. The fourth portion 41 is located between the driving chip bonding area COP and the bending area BA, and the fifth portion 42 is located in the bending area BA. The bending area BA needs to bend, so that it is necessary to use a metal layer with good ductility for wiring. Since the material of the source-drain metal layer is generally Ti/Al/Ti or its alloy structure with good ductility, the fifth portion 42 of the gate driving signal lines 4 in the bending area BA is thus prepared by using the same material as source-drain metal layer lines. The lines of the fourth portion 41 are disposed in parallel on the first gate layer Gate1 and the second gate layer Gate2. The schematic cross-sectional diagram of the parallel line design structure along the A1A2 direction is shown in FIG. 7. Gate1 illustrates the first gate layer, Gate2 illustrates the second gate layer, and there is an insulating layer between Gate1 and Gate2 layers, so that the resistance of the gate driving signal lines 4 can be reduced.

During specific implementation, in the display panel provided by the embodiment of the present disclosure, as shown in FIG. 3, the peripheral area further includes a jumper area BB, and the jumper area BB is located between the bending area BA and the display area AA.

The gate driving signal lines 4 are disposed in the same layer as the source-drain metal layer after being disposed as the first gate layer and the second gate layer in the jumper area BB.

Figure 8:
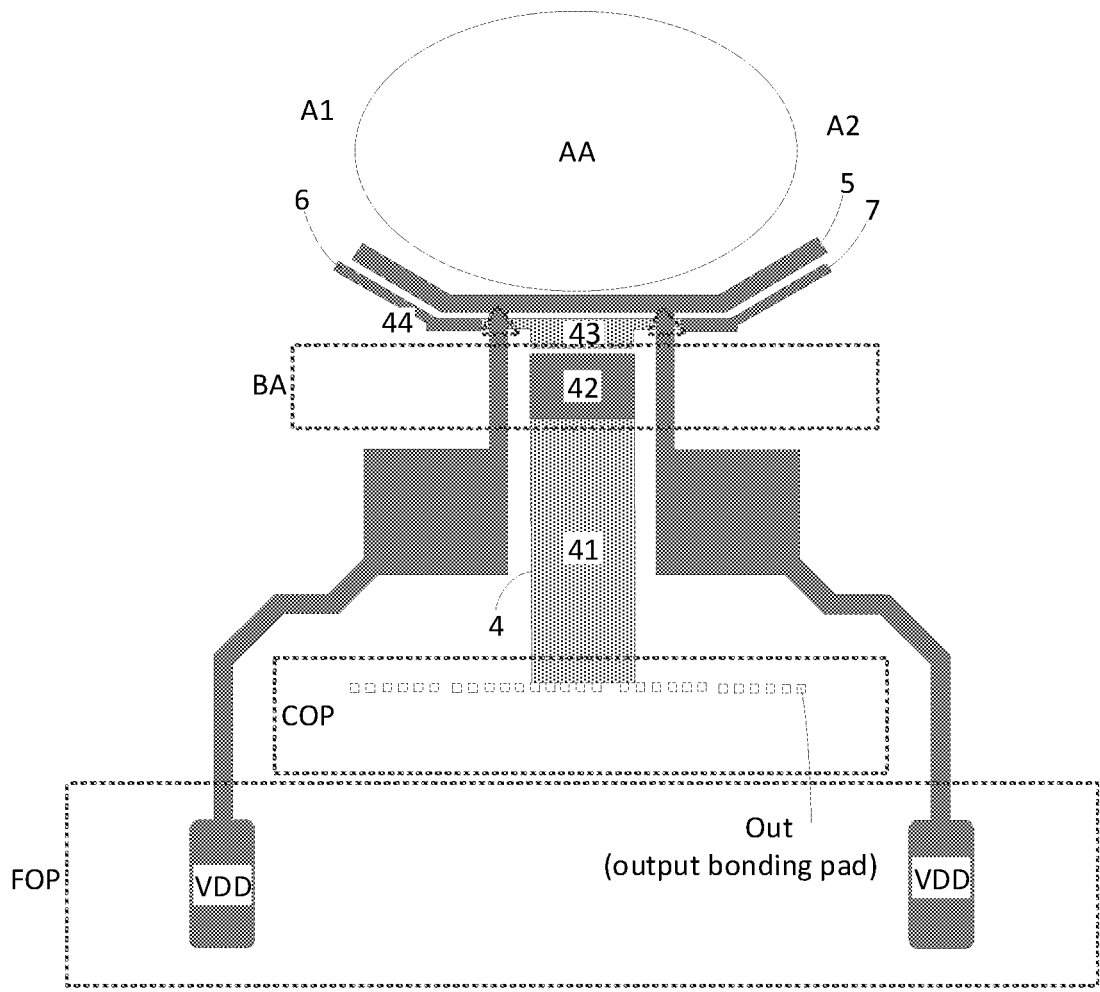
FIG. 8 is a schematic diagram of a part of structure of another display panel provided by embodiments of the present disclosure.

During specific implementation, in the display panel provided by the embodiment of the present disclosure, as shown in FIG. 8 which is a schematic diagram of a part of structure in FIG. 3, in order to illustrate more clearly the structure of the gate driving signal lines 4, the gate driving signal lines 4 further include a sixth portion 43 and a seventh portion 44 located in the jumper area BB. The sixth portion 43 starts from the bending area BA to the area where the first driving voltage lines 1 are crossed, and the seventh portion 44 goes around the display area AA following the portion crossing the first driving voltage lines 1. The lines of the sixth portion 43 are disposed in parallel in the first gate layer Gate1 and the second gate layer Gate2, and the lines of the seventh portion 44 are disposed in the same layer as source-drain metal layer.

Figure 9:
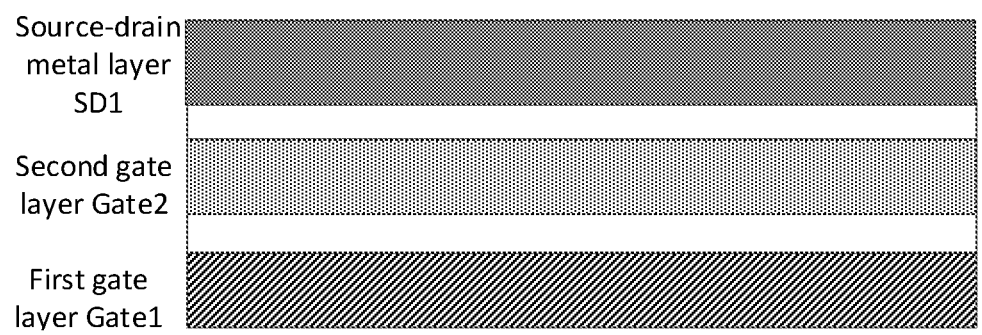
FIG. 9 is a schematic diagram of a partial cross-sectional view of another display panel provide by embodiments of the present disclosure.

Specifically, as shown in FIG. 3, in the jumper area BB, the triangular dashed line frame is schematically the overlapping area of the first driving voltage line 1 and the gate driving signal line 4, and the schematic cross-sectional diagram of the triangular dashed line frame along the A1A2 direction and the schematic cross-sectional diagram of the circular dashed line frame along the A1A2 direction are shown in FIG. 9. SD1 represents the source-drain metal layer (that is, the film layer where the first driving voltage line 1 is located).

During specific implementation, in the display panel provided by the embodiment of the present disclosure, as shown in FIG. 3, the display area AA also includes a first voltage line VDD. The jumper area BB further includes a transfer line 5, an orthographic projection of the transfer line 5 on a base substrate (not shown) of the display panel is located between an orthographic projection of the gate driving signal line 4 and an orthographic projection of the display area AA on the base substrate (not shown) of the display panel, and the first driving voltage lines 1 are electrically connected to the first voltage line VDD through the transfer line 5. That is, the present disclosure transmits driving voltage signals to the first voltage line VDD of the display area AA through at least two first driving voltage lines 1, which can reduce the VDD line load difference caused by the increase of the line resistance of the first voltage line VDD, facilitate the stability and uniformity of the VDD driving voltage on the screen, and improve the display effect.

During specific implementation, in order to improve the transmittance of the display panel, in the display panel provided by the embodiment of the present disclosure, as shown in FIG. 3, the first voltage line VDD has a metal grid structure.

During specific implementation, in the display panel provided by the embodiment of the present disclosure, as shown in FIG. 3, the first driving voltage lines 1 are VDD lines and the second driving voltage lines 2 are VSS lines.

Figure 10:
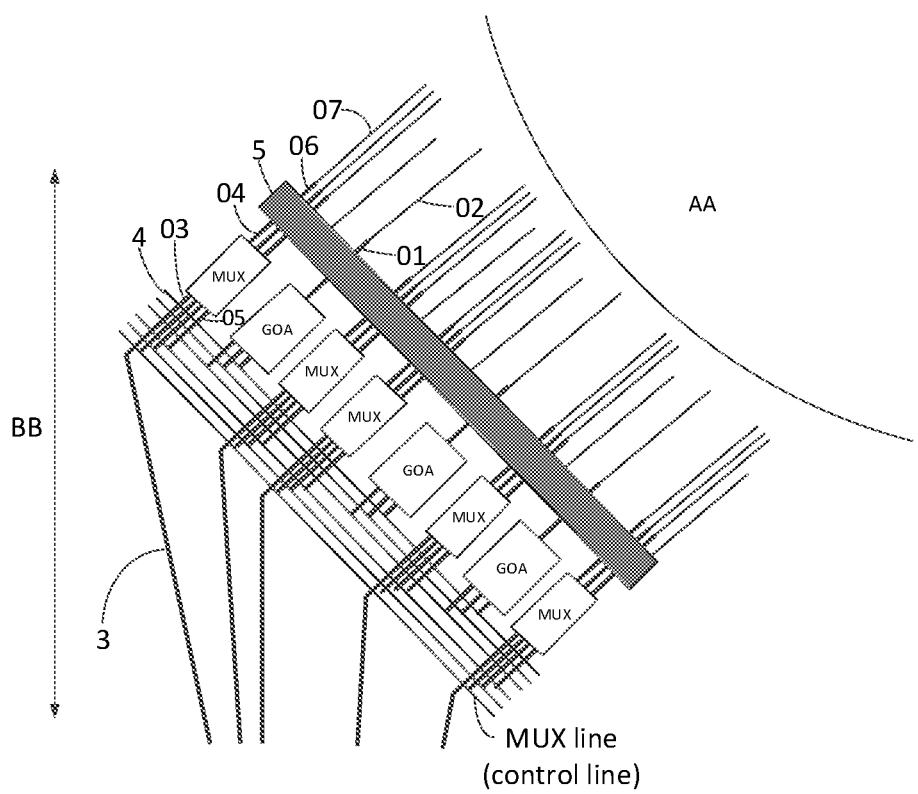
FIG. 10 is a schematic partial enlarged structure diagram of a jumper area in a display panel provided by embodiments of the present disclosure.

During specific implementation, in the display panel provided by the embodiment of the present disclosure, as shown in FIG. 10 which is an enlarged schematic diagram in an OO dashed line frame in the jumper area BB of FIG. 3, the jumper area BB also includes a plurality of cascaded gate driving circuits GOA of which orthographic projections are located between the transfer line 5 and the gate driving signal lines 4. An input end of each gate driving circuit GOA is electrically connected with at least one corresponding gate driving signal line 4. FIG. 10 illustrates an example in which the input end of each gate driving circuit GOA is electrically connected to the corresponding three gate driving signal lines 4. An output end of each gate driving circuit GOA is electrically connected to the gate line of the display area AA after crossing the transfer line 5, that is, the plurality of gate driving signal lines 4 input gating signals to the GOA, and the output end of the GOA outputs gate scanning signals to the gate line.

During specific implementation, in the display panel provided by the embodiment of the present disclosure, as shown in FIG. 10, the lines between the output ends of the gate driving circuits GOA and the gate line include an eighth portion 01 and a ninth portion 02. The eighth portion 01 starts from the output ends of the gate driving circuits GOA to the area where the transfer line 5 is crossed, and the ninth portion 02 starts from an area following that where the transfer line 5 is crossed to the display area AA. The lines of the eighth portion 01 are disposed as lines in parallel in the first gate layer Gate1 and the second gate layer Gate2, and the lines of the ninth portion 02 are disposed in the same layer as the source-drain metal layer. In order to clearly illustrate that the eighth portion 01 and the ninth portion 02 use different metal lines, the lines of the eighth portion 01 are denoted as the thicker ones, and the lines of the ninth portion 02 are denoted as the thinner ones. The thickness difference only distinguishes different metal lines and does not represent the actual thickness of the lines. Since FIG. 10 is a schematic plan diagram, the layer where lines of the eighth portion 01 shown in the figure are located are the second gate layer Gate2, and the first gate layer Gate1 is below the second gate layer Gate2.

During specific implementation, the display panel provided by the embodiment of the present disclosure, as shown in FIG. 10, further includes a plurality of multiplexers MUX of which orthographic projections are located between the transfer line 5 and the gate driving signal lines 4. The multiplexers MUX are spaced apart from the gate driving circuits GOA. Of course, the layout of the multiplexers MUX and the gate driving circuits GOA is disposed according to the space size, is not limited to the spaced setting, and is made according to the actual situation.

Each of the multiplexers MUX includes an input end 03, at least two output ends 04 and at least two control ends 05. The multiplexer MUX is exemplified by including three output ends 04 and three control ends 05. The input end 03 is electrically connected with a corresponding data signal line 3, each output end 04 is electrically connected with the data line corresponding to the display area AA after crossing the transfer line 5, and each control end 05 is electrically connected with a control line (MUX line). Thus, by controlling the timing, a data signal output from the IC can output three data signals after passing through the MUX, i.e. a 1:3MUX structure, and it may also be 1:4MUX, 1:6MUX, etc.

During specific implementation, in the display panel provided by the embodiment of the present disclosure, as shown in FIG. 10, the lines between the output ends 04 of the multiplexers MUX and the data line include a tenth portion 06 and an eleventh portion 07. The tenth portion 06 starts from the output ends of the multiplexers MUX to the area where the transfer line 5 is crossed, and the eleventh portion 07 starts from an area following where the transfer line 5 is crossed to the display area AA. The lines of the tenth portion 06 are disposed in parallel in the first gate layer Gate1 and the second gate layer Gate2, and the lines of the eleventh portion 07 are disposed in the same layer as the source-drain metal layer. In order to clearly illustrate that the tenth portion 06 and the eleventh portion 07 use different metal lines, the lines of the tenth portion 06 are denoted as the thicker ones, while the lines of the eleventh portion 07 are denoted as the thinner ones. The thickness difference only distinguishes different metal lines and does not represent the actual thickness of the lines. Since FIG. 10 is a schematic plan diagram, the layer where the lines of the tenth portion 06 shown in the figure are located are the second gate layer Gate2, and the first gate layer Gate1 is located below the second gate layer Gate2.

During specific implementation, the signal lines electrically connected to the gate driving circuits generally at least include a gate line (Gate) and a light emitting control line (EM). Therefore, in the display panel provided by the embodiment of the present disclosure, as shown in FIG. 3, the gate driving signal lines at least include a first type of gate driving signal lines 6 (electrically connected to the gate line) and a second type of gate driving signal lines 7 (electrically connected to the light emitting control line).

The first type of gate driving signal lines 6 start from the driving chip bonding area COP to go around a first side A1 of the display area AA after passing through the bending area BA.

The second type of gate driving signal lines 7 start from the driving chip bonding area COP to go around a second side A2 of the display area AA after passing through the bending area BA.

The first side A1 and the second side A2 are opposite. In this way, the different types of gate driving signal lines extend to two sides of the display panel respectively, which can make the wiring on two sides of the display panel consistent and reduce the complexity of unilateral wiring.

Of course, the display device provided by the embodiments of the present disclosure may also include other functional film layers well known to those skilled in the art, and will not be described in detail herein.

Based on the same inventive concept, an embodiment of the present disclosure also provides a display device, including the display panel provided by the embodiment of the present disclosure. The display device may be any product or component with a display function, such as a mobile phone, a tablet computer, a TV set, a display, a notebook computer, a digital photo frame, a navigator, etc. For the implementation of the display device, please refer to the above embodiment of the display panel, and it will not be repeated here. Other essential components of the display device will be understood by those of ordinary skill in the art and will not be described herein, nor should they be taken as limitations of the present disclosure.

During specific implementation, the display device provided by the embodiment of the present disclosure may be a wearable display product such as a watch.

According to the display panel and the display device provided by the embodiments of the present disclosure, on the one hand, the driving voltage signal is input to the first voltage line of the display area by adopting the at least two first driving voltage lines. Compared with the prior art in which one first driving voltage line is used to input the driving voltage signal to the first voltage line of a display area, the design of the two first driving voltage lines of the present disclosure reduces the load difference of the VDD lines caused by the increase of the line resistance, is beneficial to the stability and uniformity of the VDD driving voltage on the screen, improves the display effect, and improves the uniformity of the driving voltage signal in the display panel. On the other hand, by adopting at least one group of gate driving signal lines located between the first driving voltage lines, such gate driving signal lines reduce the load formed by overlapping of signals such as GOA and other signals as much as possible, which is beneficial to reducing the gate driving signal load and improving the luminous reliability and display effect of the OLED devices.

Although the preferred embodiments of the present disclosure have been described, additional changes and modifications may be made to these embodiments once those skilled in the art have become aware of the basic inventive concepts. As such, the claims are intended to be interpreted as including the preferred embodiments and all changes and modification falling within the scope of the present disclosure.

It will be apparent that various modifications and variations may be made to the embodiments of the present disclosure by those skilled in the art without departing from the spirit and scope of the embodiments of the present disclosure. As such, to that extent those modifications and variations of the embodiments of the present disclosure are within the scope of the claims of the present disclosure and their equivalents, the present disclosure is also intended to include such modification and variations.

What is claimed is:

1. A display panel, having a display area and a peripheral area outside the display area; wherein the peripheral area comprises a bending area, a driving chip bonding area and a flexible printed circuit bonding area, the bending area is closer to the display area than the flexible printed circuit bonding area, and the driving chip bonding area is located between the bending area and the flexible printed circuit bonding area;

wherein the display panel comprises:
at least one group of gate driving signal lines, wherein the gate driving signal lines start from the driving chip bonding area to go around the display area after passing through the bending area; and
at least two first driving voltage lines, wherein the at least two first driving voltage lines respectively start from the flexible printed circuit bonding area, go through the bending area after passing through two sides of the driving chip bonding area, and extend to be close to the display area, and the at least two first driving voltage lines are respectively located at two sides of the at least one group of gate driving signal lines;
wherein a plurality of data lines are provided in the display area, data signal lines are provided in the peripheral area, and the data signal lines start from the driving chip bonding area and are electrically connected with the plurality of data lines after passing through the bending area; and
the first driving voltage lines and the data signal lines have an overlapping area between the bending area and the driving chip bonding area, and the first driving voltage lines cover the data signal lines in the overlapping area.

2. The display panel according to claim 1, wherein a quantity of groups of the gate driving signal lines is one, and a quantity of the first driving voltage lines is two; and
the group of gate driving signal lines starting from the driving chip bonding area and passing through the bending area is located in a central area of the display panel, and the two first driving voltage lines are symmetrically disposed relative to the gate driving signal lines.

3. The display panel according to claim 1, further comprising: two second driving voltage lines located outside the at least two first driving voltage lines, wherein the two second driving voltage lines start respectively from the flexible printed circuit bonding area and go around the display area after passing through the bending area; and the two second driving voltage lines are symmetrically disposed relative to the gate driving signal lines.

4. The display panel according to claim 3, wherein two groups of the data signal lines located between the gate driving signal lines and the second driving voltage lines are provided in the peripheral area, and the two groups of data signal lines are symmetrically disposed relative to the gate driving signal lines.

5. The display panel according to claim 4, wherein the data signal lines comprise a first portion, a second portion and a third portion;
wherein the first portion is located between the bending area and the driving chip bonding area, the second portion is located in the bending area, and the third portion is located between the display area and the bending area; and the first portion and the third portion are disposed as alternating lines in a first gate layer and a second gate layer, and the second portion is disposed in a layer same as a source-drain metal layer.

6. The display panel according to claim 3, wherein the first driving voltage lines and the second driving voltage lines are disposed in a layer same as a source-drain metal layer.

7. The display panel according to claim 1, wherein the gate driving signal lines comprise a fourth portion and a fifth portion;
where the fourth portion is located between the driving chip bonding area and the bending area, and the fifth portion is located in the bending area; and
the fourth portion is disposed in parallel in a first gate layer and a second gate layer, and the fifth portion is disposed in a layer same as a source-drain metal layer.

8. The display panel according to claim 1, wherein the peripheral area further comprises a jumper area, and the jumper area is located between the bending area and the display area; and
the gate driving signal lines are disposed in a source-drain metal layer after the gate driving signal lines are disposed in parallel in a first gate layer and a second gate layer in the jumper area.

9. The display panel according to claim 8, wherein the gate driving signal lines further comprise a sixth portion and a seventh portion located in the jumper area;
where the sixth portion starts from the bending area to an area where the first driving voltage lines are crossed by the gate driving signal lines, and the seventh portion goes around the display area from the area where the first voltage lines are crossed by the gate driving signal lines; and
the sixth portion is disposed in parallel in the first gate layer and the second gate layer, and the seventh portion is disposed in a layer same as a source-drain metal layer.

10. The display panel according to claim 8, wherein a first voltage line is provided in the display area, and a transfer line is provided in the jumper area;
an orthographic projection of the transfer line is located between an orthographic projection of the gate driving signal lines and an orthographic projection of the display area; and
the first driving voltage lines are electrically connected with the first voltage line through the transfer line.

11. The display panel according to claim 10, wherein a plurality of cascaded gate driving circuits of which orthographic projections are located between the transfer line and the gate driving signal lines are further provided in the jumper area;
an input end of each gate driving circuit is electrically connected with at least one corresponding gate driving signal line; and
an output end of each gate driving circuit is electrically connected with a gate line of the display area after crossing the transfer line.

12. The display panel according to claim 11, wherein lines between the output ends of the gate driving circuits and the gate line comprise an eighth portion and a ninth portion;
the eighth portion starts from the output ends of the gate driving circuits to an area where the transfer line is crossed by the lines between the output ends of the gate driving circuits and the gate line, and the ninth portion starts from the area where the transfer line is crossed by the lines between the output ends of the gate driving circuits and the gate line to the display area; and
the eighth portion are disposed in parallel in the first gate layer and the second gate layer, and the ninth portion is disposed in a layer same as the source-drain metal layer.

13. The display panel according to claim 11, further comprising a plurality of multiplexers of which orthographic projections are located between the transfer line and the gate driving signal lines, wherein the multiplexers are spaced apart from the gate driving circuits; and
each of the plurality of multiplexers comprises an input end, at least two output ends and at least two control ends, the input end is electrically connected with a corresponding data signal line, each output end is electrically connected with corresponding data line in the display area after crossing the transfer line, and each control end is electrically connected with a control line.

14. The display panel according to claim 1, wherein the gate driving signal lines at least comprise a first type of gate driving signal lines and a second type of gate driving signal lines;
the first type of gate driving signal lines start from the driving chip bonding area and go along a first side of the display area after passing through the bending area;
the second type of gate driving signal lines start from the driving chip bonding area and go along a second side of the display area after passing through the bending area; and
the first side and the second side are opposite.

15. The display panel according to claim 10, wherein a trace design of the first voltage line is in a metal grid structure.

16. The display panel according to claim 3, wherein the first driving voltage lines are lines for providing operating voltage to light emitting elements in the display panel, and the second driving voltage lines are lines for common connection.

17. A display device, comprising a display panel, wherein the display panel has a display area and a peripheral area outside the display area; wherein the peripheral area comprises a bending area, a driving chip bonding area and a flexible printed circuit bonding area, the bending area is closer to the display area than the flexible printed circuit bonding area, and the driving chip bonding area is located between the bending area and the flexible printed circuit bonding area;
wherein the display panel comprises:
at least one group of gate driving signal lines, wherein the gate driving signal lines start from the driving chip bonding area to go around the display area after passing through the bending area; and
at least two first driving voltage lines, wherein the at least two first driving voltage lines respectively start from the flexible printed circuit bonding area, go through the bending area after passing through two sides of the driving chip bonding area, and extend to be close to the display area, and the at least two first driving voltage lines are respectively located at two sides of the at least one group of gate driving signal lines;
wherein a plurality of data lines are provided in the display area, data signal lines are provided in the peripheral area, and the data signal lines start from the driving chip bonding area and are electrically connected with the plurality of data lines after passing through the bending area; and the first driving voltage lines and the data signal lines have an overlapping area between the bending area and the driving chip bonding area, and the first driving voltage lines cover the data signal lines in the overlapping area.

\* \* \* \* \*